United States Patent [19]

Kawada et al.

[11] Patent Number: 5,180,048
[45] Date of Patent: Jan. 19, 1993

[54] MAGNETIC LEVITATING TRANSPORTATION SYSTEM

[75] Inventors: Noriyuki Kawada; Shigeki Morii; Motomi Nakashima; Jin Yamada; Akitami Kaneko, all of Hiroshima, Japan

[73] Assignee: Mitsubishi Jukogyo Kabushiki Kaisha, Tokyo, Japan

[21] Appl. No.: 736,458

[22] Filed: Jul. 26, 1991

[30] Foreign Application Priority Data

Oct. 12, 1990 [JP] Japan .................. 2-274412
Mar. 4, 1991 [JP] Japan .................. 3-37177
Mar. 20, 1991 [JP] Japan .................. 3-56807

[51] Int. Cl.⁵ .................................... B65G 35/00
[52] U.S. Cl. ............................ 198/619; 104/282
[58] Field of Search ............ 104/282, 281, 284; 198/619

[56] References Cited

U.S. PATENT DOCUMENTS 3,589,300 6/1971 Wipf ........................ 104/281
3,662,635 5/1972 Yabuta ................... 198/619 X
3,675,757 7/1972 Yabuta ................... 198/619
4,624,617 11/1986 Belna ....................... 104/282

FOREIGN PATENT DOCUMENTS 398382 2/1974 U.S.S.R. .................. 198/619
1288985 9/1972 United Kingdom ..... 198/619

OTHER PUBLICATIONS

Patent Abstracts of Japan, unexamined applications, M field, vol. 9, No. 172, Jul. 17, 1985, The Patent Office Japanese Government, p. 124 M 397 *Kokai-No. 60-44 425 (Shinko Denki K.K.)*.

Primary Examiner—Robert J. Oberleitner
Assistant Examiner—Kevin D. Rutherford
Attorney, Agent, or Firm—McAulay Fisher Nissen Goldberg & Kiel

[57] ABSTRACT

The present invention relates to a magnetic levitating transport system for transporting a levitating body composed of conductive paramagnetic or non-magnetic metal above electromagnet arrays by generating an alternating magnetic field in a pair of parallel electromagnet arrays.

The dimensions of the levitating body are expressed in relation to dimensions of the electromagnet arrays, as well as, other dimensions of the levitating body. The specific symmetrical shape, having a flat underside, allows the levitating body to manoeuvre a curve having a large curvature. In addition, perpendicular direction changes are effected using transportation passages.

15 Claims, 15 Drawing Sheets

CONVEYING DIRECTION

MAGNETIC LEVITATING TRANSPORTATION SYSTEM

FIELD OF THE INVENTION AND RELATED ART STATEMENT

The present invention relates to a magnetic levitating transportation system applied to a transportation apparatus in which it is necessary to transport an object in a non-contact manner such as a wafer transportation apparatus in a semiconductor manufacturing apparatus which detects dust generation, transportation in vacuum which detects splash of lubricating oil, and a transportation apparatus in a high temperature atmosphere.

(1) Conventionally what is called a magnetic bearing in which a permanent magnet or an electromagnet is used has been used for a bearing of transporting or moving mechanism of an object (a semiconductor wafer and the like) in a semiconductor manufacturing process line and the like which detects dust generation, splash of lubricating oil and the like. With this device, a transported object or a supported object is levitated in a non-contact manner through an air gap by utilizing a magnetic attraction force or a repulsion force acting between magnets or between a magnet and a magnetic material.

Variety of inventions and devices have been made in a field of this category, and many of them have been put to practical use already.

Among them, a magnetic bearing using an electromagnet which utilizes a magnetic attraction force has such a merit that required electric power is small. However, due to the fact that originally unstable attraction force has to be stabilized by electrical control, the magnetic bearing has such drawbacks that a control unit is required, and plenty of incidental units such as a gap sensor are required for the control unit.

In particular, in case of transportation at a long distance with the magnetic bearing in which an electromagnet is used so as to utilize a magnetic attraction force, it is required to provide these control units over the whole transportation line.

As a means for evading the foregoing, a means in which a required control circuit and a sensor are mounted on a side of a body which is transported while being levitated may be considered. In this case, however, it is required to provide an electric power source such as a battery on the side of the body, which gives rise to a big problem in point of facilities such that charging and feeding systems are newly required for the use for many hours.

On the other hand, a magnetic bearing utilizing a magnetic repulsion force has a big advantage in point of an apparatus as a transportation mechanism for a long distance because of such a reason that a control unit as described above is not required in principle. However, it has been deemed impossible practically to construct a repulsion levitating mechanism by combining permanent magnets only, and it is said that it is required to stabilize a degree of freedom on at least one axis and more by means of above-described control unit.

As against the above, it has been confirmed in principle that an inductive repulsion system using an a.c. electromagnet levitates and supports a levitating body stably by devising a configuration of the levitating body made of a conductive material.

FIG. 19 shows a basic construction of a transportation system of a conductive repulsion type using the a.c. electromagnets.

In FIG. 19, a reference numeral 1 denotes a.c. electromagnets composed of two pieces of electromagnets installed in parallel in a transporting direction, and 2 denotes a levitating body which is transported above the a.c. electromagnets. A material which is light in weight and highly conductive such as aluminum is suitable for the levitating body 2, and a transportation body to be conveyed is placed usually on this levitating body 2.

In FIG. 19, when an alternating current is applied to the a.c. electromagnets 1, an alternating magnetic field is generated above the top portion thereof. Since the levitating body 2 is located in that magnetic field, an alternating current called an eddy current flows in the aluminum material of the levitating body 2.

Since the magnetic field generated by this current is formed just in a repulsing direction against the magnetic field produced by the electromagnets 1, an upward levitating force shown at F1 in the figure acts onto the levitating body 2 by the repulsion force.

In case the levitating body 2 is constructed simply of a flat plate, however, this levitating force has no steering force which stabilizes in a horizontal direction. Therefore, the levitating body 2 slips out of place in either left or right direction from the transporting direction, and gets out of the track of the electromagnets 1 and drops easily.

In FIG. 19, a portion having a section in a V-shape which projects downward is provided at a central portion in the same direction as the conveying direction of the levitating body 2 shown by an arrow mark I in FIG. 19 (b) in order to prevent the foregoing. A steering force acts on the levitating body 2 in a horizontal direction shown at F2 by the action of the V-shaped portion and the magnetic field of the electromagnets 1, and, even when the levitating body 2 gets out of the track of the electromagnets 1, the steering force F2 in the shifting direction becomes larger and pushes back the levitating body 2. Thus, it becomes possible to have the levitating body 2 travel stably along the track.

Besides, it is possible to have the levitating body 2 travel by having a driving force F3 function by driving electromagnet arrays shown in FIG. 19 (b) in a linear motor form.

The foregoing shows the transportation principle of a transportation system of a inductive repulsion type in which a.c. electromagnets are used. According to this system, the underside configuration of the levitating body 2 is not flat. Therefore, there is no problem in conveying it on a linear track, but above-mentioned V-shaped portion is an obstacle in conveying along a curve having a big curvature, a turnout in a perpendicular direction and the like, which makes realization difficult.

In particular, when an application to sheet-feed transportation of wafers in a semiconductor process is considered, branch portions become indispensable for feeding to respective process units as described later. Thus, there has been a limit in application of a transportation system of a inductive repulsion type using a.c. electromagnets.

As described in detail above, track branching has been difficult with the conventional levitating body configuration of a inductive repulsion type in which a.c. electromagnets are used, and it has been inapplicable to a transportation line requiring track alteration such as wafer transportation in a semiconductor manufacturing process line of a multichamber system.

(2) For example, FIG. 20 shows an example of a magnetic levitating transportation system in which wafers and the like are transported in a conventional semiconductor manufacturing apparatus.

As shown in FIG. 20, various types of processing apparatus (a cleaning section 102, a resist application section 103, an electron beam direct drawing section 104, a development section 105, an etching section 106, an ion implantation section 107, a furnace 108, a thin film application section 109, an inspection section 110 and the like) are installed directly along a main transportation passage 101 in a clean room 100. An object to be processed (semiconductor wafer) 111 enters first into the clean room 100 through a wafer inlet port 112, and is processed in consecutive order while passing through processed groups as flowing in above-mentioned main transportation passage 101 and taken out again of a wafer outlet port 113. (See FIG. 5. 26 in a book titled "Basis of Thin Film Formation", 2nd edition, written by Tatsuo Asamaki.)

A magnetic transportation system by a inductive repulsion method using a.c. electromagnets is known as one of these transportation systems. In this inductive repulsion method, a levitating body is levitated and supported stably by variously devising the configuration of the levitating body composed of a conductive material, and an object to be processed (a semiconductor wafer) is placed on the top surface of the levitating body and transported.

Thereupon, since various types of processing apparatus 102 to 110 are installed directly in the main transportation passage 101 in a transportation system according to the prior art described previously, an action that an object to be processed 111 stops once immediately before respective processing apparatus 102 to 110 is required.

Accordingly, there is such a problem that, even if a plurality of objects to be processed are sent into the transportation system, they cannot pass others unless the objects to be processed have entered into the processing apparatus.

Further, there is also a problem that succeeding objects to be processed which are arriving in succession can not move during the time required for going in and out at respective processing apparatus.

As a result, such drawbacks are produced that respective installed processing apparatus cannot be utilized effectively time-wise, and the production efficiency is low substantially since the residence period of the object to be processed is long.

OBJECT AND SUMMARY OF THE INVENTION

It is an object of the present invention which has been made in view of such circumstances to provide a magnetic levitating transportation system in which resolution of above-described drawbacks is aimed at while making the most of the advantage of a inductive repulsion system using a.c. repulsion electromagnets, and a steering function is provided by devising the configuration though the levitating body is constructed of a flat plate having the underside in a flat configuration.

It is another object of the present invention to provide a magnetic levitating transportation system in which a production efficiency is improved by a large margin.

The gist of the present invention for achieving above-described objects is as described hereunder.

(1) A magnetic levitating transportation system for levitating and transporting a levitating body composed of conductive paramagnetic or non-magnetic metal above electromagnet arrays by generating an alternating magnetic field in a pair of electromagnet arrays installed in parallel, characterized in that, the levitating body is constructed of a plate member formed of, when it is assumed that an inner distance of above-mentioned pair of electromagnet arrays is at a and the outer distance thereof is at d, for example, a cross plate member formed of a central portion having a dimension of a length in a width direction (hereinafter referred to as A) longer than a but shorter than d and a length in a transporting direction (hereinafter referred to as C) two times and more as long as an electromagnet pitch, and projected portions formed symmetrically at both ends in the width direction of above-mentioned central portion in a dimension of a length in the width direction (hereinafter referred to as D) longer than $(d-A)/2$ and a length in the transporting direction (hereinafter referred to as B) at the electromagnet pitch and longer, and the underside configuration of the levitating body may be made flat. As a result, not only a curve having a big curvature but also an orthogonal branch are made possible for the construction of the track, and big flexibility may be provided in designing of a transportation line.

(2) A magnetic levitating transportation system according to above-described item (1), characterized in that above-described levitating body is constructed of, for example, a cross plate member which satisfies such conditions that respective lengths A, B, C and D meet $a < B < d$ and $A + 2D \geq$ electromagnet pitch $\times 2$, and that $d < c$ and the electromagnet pitch $\leq A$, and has a configuration of the levitating body adaptable to a track branched at right angles from the existing track.

When the levitating body in above-described item (1) is branched at right angles, a levitating body having a configuration in which above-mentioned central portion and above-mentioned projected portions just change places with each other is obtainable. Thus, both have an interchangeable relationship with each other and flexibility may be given to designing of a transportation line.

(3) A magnetic levitating transportation system according to above-described items (1) and (2), characterized in that bevels are formed on sides which meet at right angles with the transporting direction of above-mentioned central portion or projected portions.

According to the present invention, bevels are formed on an end surface which meets at right angles with the transporting direction of at least one of the central portion and the projected portions of the levitating body, thus setting an angle of an end surface which meets at right angles with above-mentioned transporting direction at an angle not meeting at right angles with the transporting direction. As a result, the variation of the steering force in the transporting direction produced on the end surface is averaged. With this, the travelling resistance in the transporting direction is reduced, thus resulting in reduction of pitching oscillation. Namely, it becomes possible to reduce pitching by a very simple construction of only forming bevels on the end surface which meets at right angles with the transporting direction, thereby to make it possible to provide a system which is cheap, inexpensive and highly reliable.

(4) A magnetic levitating transportation system according to above-described item (2), characterized in that, in above-described pair of electromagnet arrays installed in parallel, other one or more pairs of electromagnet arrays which meet at right angles with or are branched off at right angles from above-mentioned electromagnet arrays are installed.

It is possible to enlarge and install the transportation passage network and make the most of transportation with a levitating body in a wide range by providing another transportation passage which meets at right angles with or is branched off at right angles from a main transportation passage in above construction.

(5) A magnetic levitating transportation system according to above-described item (2), characterized in that turnout transportation passages are provided in above-mentioned pair of electromagnet arrays installed in parallel, these turnout transportation passages consisting of other two pairs of electromagnet arrays which meet at right angles with or are branched off at right angles from above-mentioned electromagnet arrays and still another pair of electromagnet arrays which meet at right angles with above-mentioned two pairs of electromagnet arrays.

Furthermore, a feature is constituted in that a processing apparatus which processes an object to be processed placed on above-mentioned levitating body is installed at the location of above-mentioned still another pair of electromagnet arrays which meet at right angles with above-mentioned two pairs of electromagnet arrays.

In above-described construction, a levitating body travelling in the main transportation passage is drawn into the turnout transportation passages where various processing apparatus are installed, and respective processing is performed there. Since no levitating body which is at a standstill in the main transportation passage exists during this period, it becomes possible to have a plurality of levitating bodies come and go optionally among processing apparatus.

Further, holding and suspension spaces can also be provided in the turnout transportation passages, which further makes it possible to adjust the time among respective processing apparatus.

(6) A magnetic levitating transportation system according to above-described item (4), characterized in that there is provided a means which changes over electromagnet coils at a position which meets at right angles with or is branched off at right angles from above-mentioned pair of electromagnet arrays installed in parallel with each other as one for electromagnet array in either of directions.

When the levitating body is transported from above one electromagnet line to above another in the above case, a magnetic pole coil of a common electromagnet is connected with a magnetic pole coil of one electromagnet line first so as to apply current, and the levitating body is transported above one electromagnet line. When the levitating body arrives at a point of intersection of one electromagnet line and another, the magnetic pole coil of above-mentioned common electromagnet is changed over for connection from one electromagnet line to a magnetic pole coil of an electromagnet of another electromagnet line by the change-over means, a current is applied to another electromagnet line, and the levitating body is transported above another electromagnet line.

Since it becomes thus possible to use the magnetic pole coil of the common electromagnet in common, it is possible to lower the height of the common electromagnet as compared with a conventional system, and application to an apparatus for manufacturing semiconductors and the like in which there are many restrictions in point of space becomes advantageous. Further, since the magnetic resistance of the coil is small, the number of turns of the coil is reduced, thus making it possible to cut down power consumption.

DETAILED DESCRIPTION OF THE PREFERRED EMBODIMENTS

The First Embodiment

A first embodiment of the present invention will be described hereafter with reference to the drawings.

Figure 1A:
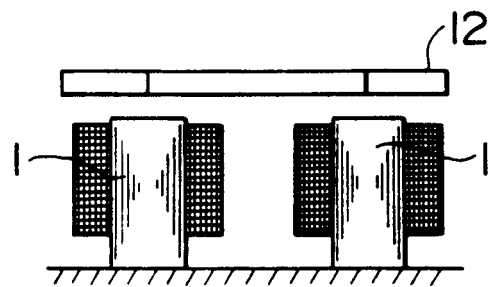
FIG. 1 shows diagrams for explaining a basic construction according to a first embodiment of the present invention.
Figure 1B:
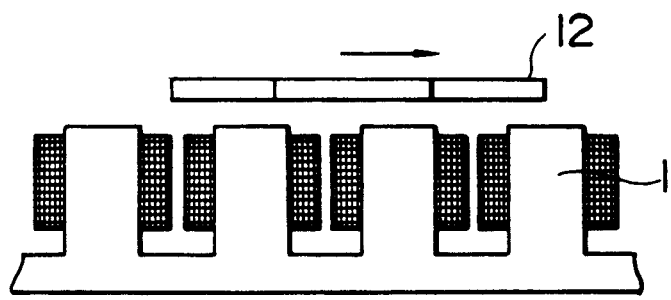
Figure 1C:
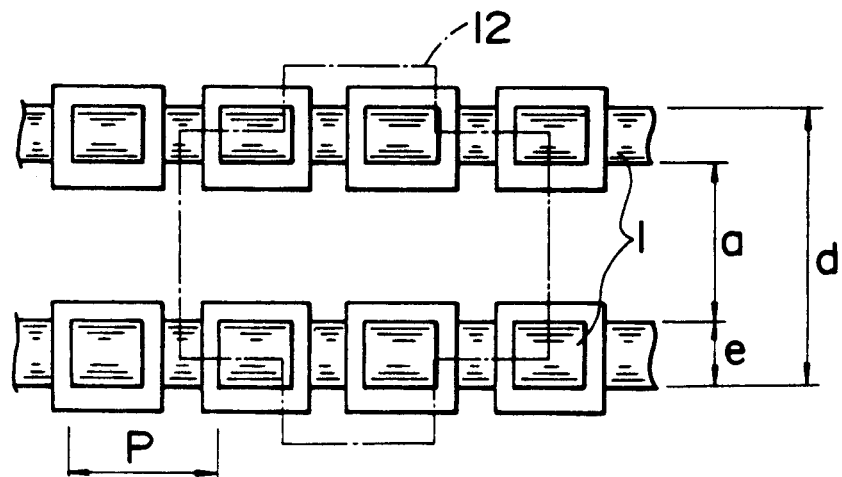
Figure 19A:
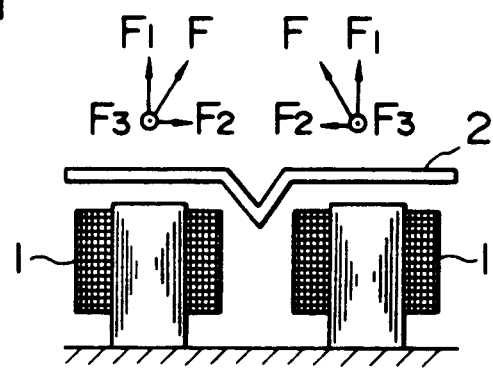
FIG. 19 shows a basic construction of a conventional magnetic levitating transportation system, in which FIG. 19 (a) is a front view thereof, FIG. 19 (b) is a side view and FIG. 19 (c) is a plan view.
Figure 19B:
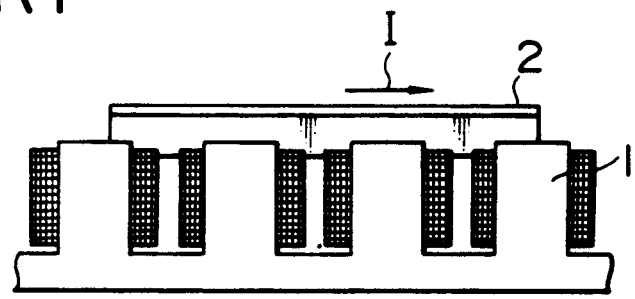
Figure 19C:
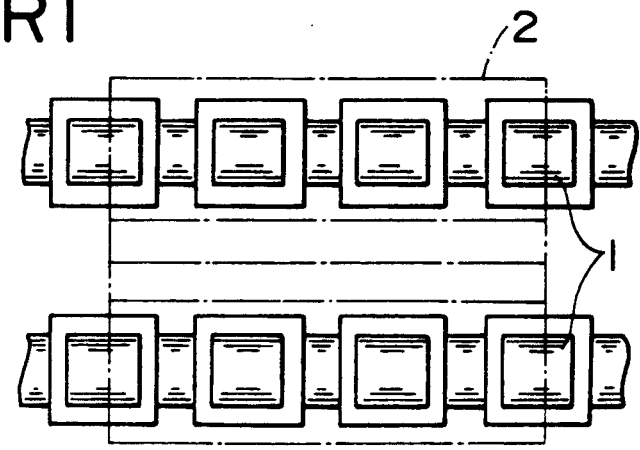
Figure 20:
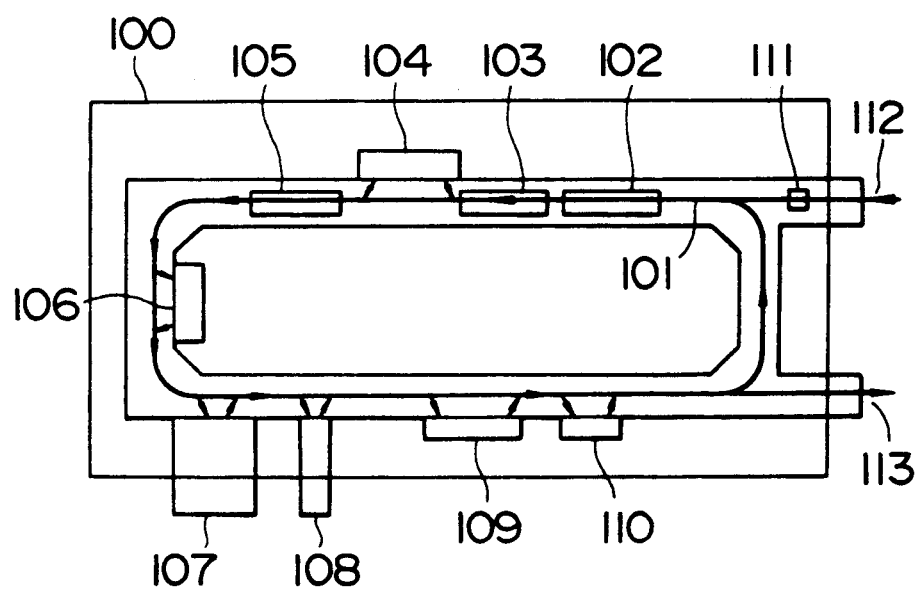
FIG. 20 is a schematic diagram showing a conventional transportation system.

FIG. 1 shows a basic construction, and the arrangement of a.c. electromagnets is the same as that shown in FIG. 19. FIG. 1 (a) is a front view, FIG. 1 (b) is a side view, and FIG. 1 (c) is a plan view.

Figure 2:
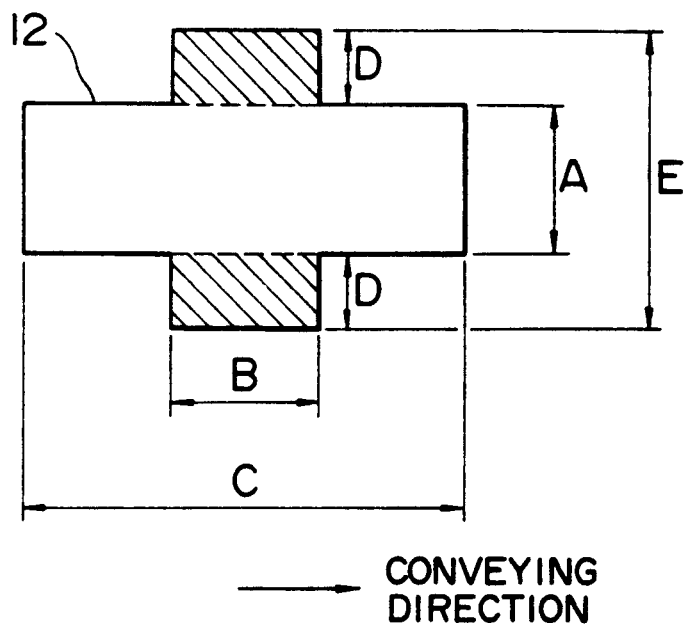
FIG. 2 is a diagram for explaining a configuration of a levitating body shown in FIG. 1.

In FIG. 1, a reference numeral 12 denotes a levitating body, and the levitating body 12 is of a planar type having a configuration in an almost cross shape as shown with a one-dot line in the plan view shown in FIG. 1 (c). FIG. 2 shows the configuration of the levitating body 12. An aluminum material is usually optimum for the material of the levitating body 12 in order to generate a big levitating force using a light and highest possible conductivity as described previously.

In the next place, dimensional conditions of the levitating body 12 will be itemized as follows.

(1) A width E of a larger portion including portions projecting on both sides shown with hatching in the figure is made larger than an outer width d of a track of the electromagnets 1.

(2) A width of the smaller portion, viz., the width A of a central portion which does not include above-described projected portions is made wider than the inner width a of the track of the electromagnets and narrower than the outer width d.

(3) A length C in the conveying direction is made two times and more as wide as a pitch width P of yokes of the electromagnets.

(4) A length B in the conveying direction of the portions projected on both sides is made at the pitch width P of the yokes of the electromagnets and longer.

(5) A thickness of the levitating body 12 (in paper face direction in FIG. 2) is made to be such a thickness that required levitating force is generated.

Next, the operation of generating a steering force with the dimensional configuration described above will be explained with reference to FIG. 3.

Figure 3A:
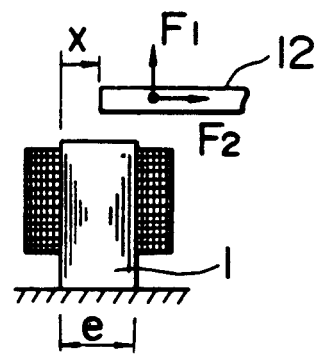
FIG. 3 shows diagrams showing a principle of generating a steering force.
Figure 3B:
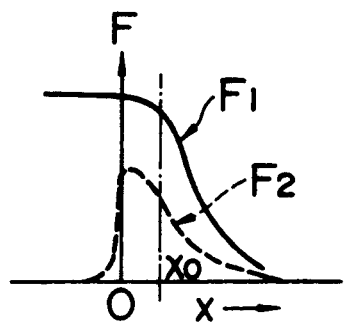

In FIG. 3, a status of generating a levitating force F1 and a steering force F2 produced in accordance with the relationship between the electromagnet yoke and the edge location at an edge portion on one side in the width direction of the levitating body 12 is shown in FIG. 3 (a). Further, FIG. 3 (b) shows the characteristic that both the levitating force F1 and the steering force F2 are reduced as the edge position of the levitating body 12 enters inside of the yoke.

Both the levitating force F1 and the steering force F2 are basically forces which are pushed away by the repulsion action of an alternating current from the electromagnets 1. Among those forces, the steering force F2 reaches the maximum in the vicinity of the yoke edge, and reduces sharply when the edge of the levitating body 12 appears outside therefrom, which cannot be expected as the steering force F2 at all as described previously. On the other hand, when the edge of the levitating body 12 draws back inside, the steering force F2 shows a gentle reduction tendency, and some force is generated even if the yoke width a is exceeded. In this state, it is assumed, for example, that the width A at the central portion of the levitating body 12 is set so that an origin of the edge of the levitating body 12 is positioned at a location $X_0$ in FIG. 3.

Next, when it is assumed that the edge is shifted horizontally to either right or left, the pushing back force F2 increases at the edge portion which has shifted in a direction that X is reduced, and decreases conversely on the opposite side. Thus, a steering force which restores the dislocation to an original state acts by above-described operation.

Figure 4:
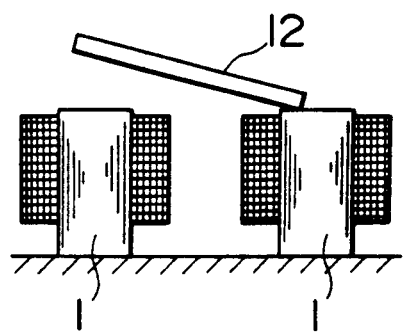
FIG. 4 is a diagram for explaining the necessity of a steering force of a levitating body.

However, when there is no projected portion shown with hatching in FIG. 2 in the levitating body 12, the levitating force F1 on the side to which the restoring force is acting is increased, and conversely, the levitating force F1 is decreased on the side where the restoring force is decreased. As a result, the levitating body 12 is rotated in a rolling direction until a state in which one side thereof comes into contact with the electromagnet yoke is presented with the conveying direction as an axis, as shown in FIG. 4. If there are projected portions described above on the levitating body 12, however, the levitating force is secured to some extent by these portions even if dislocation in the horizontal direction is generated. Thus, a situation that the edge portion of the levitating body 12 comes into contact with the electromagnet yoke does no longer exist, and dislocation is corrected by above-described steering effect. The length at B required for securing this levitating force takes approximate values shown in above-described item (4).

When the foregoing is put in order, a steering force for not to run off the track 1 at the edge portion in parallel with the conveying direction of the portion of the width A is generated in the configuration of the levitating body 12 shown in FIG. 2. Further, the minimum levitating force required so that the rotation of the levitating body 12 does not become unstable in that case is secured by the projected portions having a width D and a length B shown with hatching.

Figure 5:
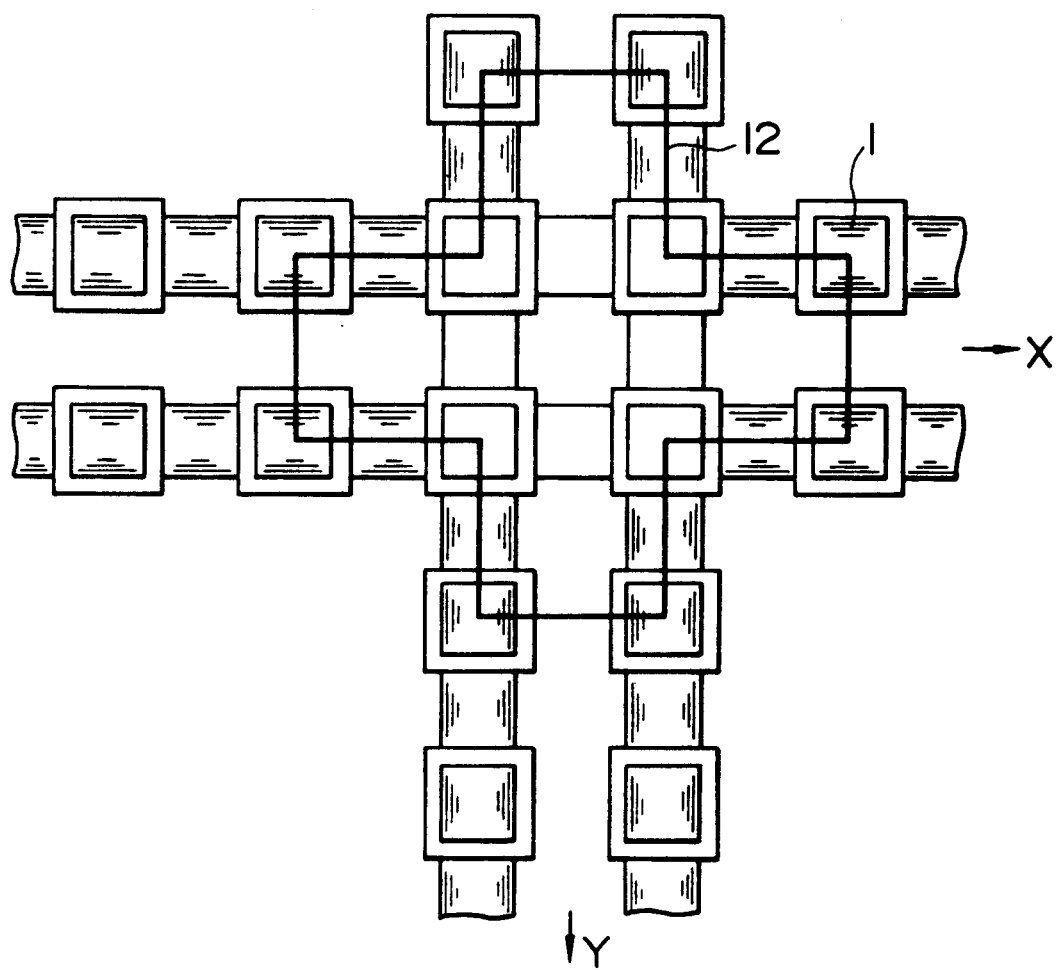
FIG. 5 is a diagram for explaining transportation in transportation passages which are branched off at right angles.

Next, an embodiment in case the track 1 is branched off at right angles is shown with reference to FIG. 5. In this case, the configuration of the levitating body 12 shows A = B and C = E (= A + 2D), and has a complete rotation symmetrical shape with respect to the center.

For example, the levitating body 12 which has travelled in a direction shown with an arrow mark X in the figure is suspended at the branch center in a state shown by controlling a driving force of a linear motor. Next, it is assumed that the levitating body 12 is driven and conveyed in Y-direction under exactly same conditions as above-mentioned X-direction by the start of linear motor driving in the direction shown with an arrow mark Y.

In this case, since the levitating body 12 has a complete rotation symmetrical shape at an angle of rotation of 90° due to above-described configuration, branching off at right angles from the X-direction to the Y-direction at above branch point becomes possible.

Figure 6:
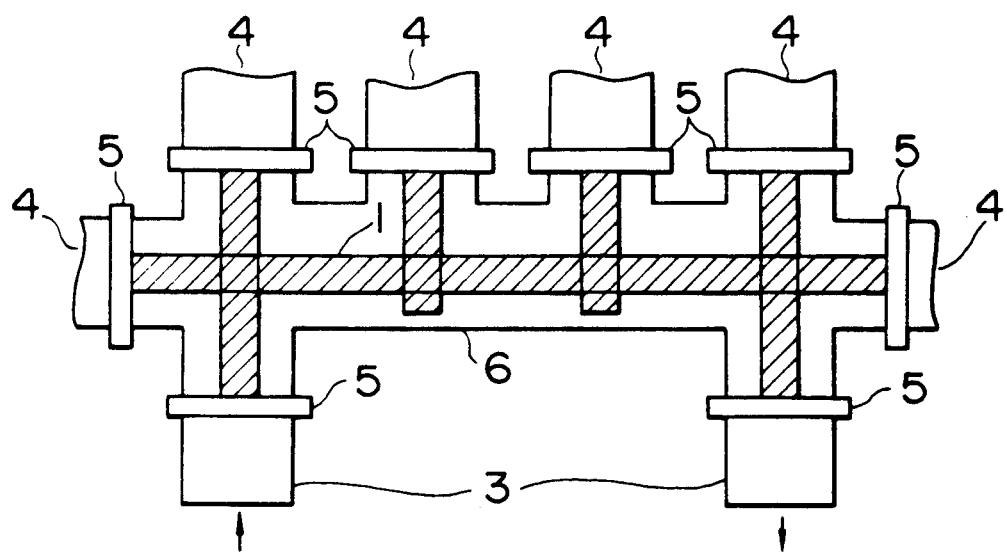
FIG. 6 is a diagram showing an application example in case of application to wafer transportation in a semiconductor manufacturing process.

Next, an application example in case a transportation system of the present invention is applied to wafer transportation in a semiconductor manufacturing process will be shown with reference to FIG. 6.

A reference numeral 3 in the figure indicates stations for carrying in and carrying out the wafers, and a transportation chamber 6 is connected thereto in a U-shape form for instance. The inside of the transportation chamber 6 is always kept vacuum. The transportation passage 1 composed of electromagnets shown with hatching is installed in this transportation chamber 6, and is devised so that it may be branched off to respective process chambers 4 on the halfway of the transportation passage by means of T-shaped or cross branching. 5 indicates gate valves for isolating the process chambers from the transportation passage 1.

With such a construction, a levitating body not shown on which a semiconductor wafer is placed travels while being levitated above the transportation passage 1, and is branched off to respective process chambers 4 through T-shaped or cross branching by driving force control of a linear motor.

Besides, the levitating body 12 has been described to be of a cross type in above-described embodiment. However, the present invention is not limited thereto, but may be formed to have an H-shaped configuration by forming the projected portions for generating a steering force for not to be off the track and not making the levitating body unstable in rotation at two locations each at respective both ends instead of the central portion of both ends in the width direction of the central portion. Further, the projected portions may be formed similarly at a front end portion or a rear end portion at both ends in the width direction of the central portion so as to obtain a T-shaped or inverted T-shaped configuration.

As described above in detail, according to the present invention, there is provided a magnetic levitating transportation system in which a levitating body composed of a conductive non-magnetic metal is levitated and transported above electromagnet arrays by generating an alternating magnetic field in two lines of electromagnet arrays installed in parallel with the transporting direction, wherein, when it is assumed that the inner distance of above-mentioned two lines of electromagnet arrays is at a and the outer distance thereof is at d, the above-mentioned levitating body is constructed of, for example, a cross plate member formed of a central portion having such dimensions that the length in the width direction thereof (hereinafter referred to as A) is longer than a but shorter than d and the length in the transporting direction (hereinafter referred to as C) is two times and more as long as the electromagnet pitch, and projected portions formed symmetrically at both ends in the width direction of the central portion in such dimensions that the length in the width direction thereof (hereinafter referred to as D) is longer than $(d-a)/2$ and the length in the transporting direction thereof (hereinafter referred to as B) is at the electromagnet pitch and longer, thus making it possible to make the underside configuration of the levitating body flat. Accordingly, it is not only possible to construct the track with a curve of a large curvature, but also to enable branching off at right angles and a very flexible design in constructing a levitating transportation system, thus making it possible to provide a magnetic levitating transportation system which contributes greatly to make the system compact at a low cost.

The Second Embodiment

Such a system as described above, however, had a problem that oscillation in the transporting direction called pitching is generated in the levitating body 12 due to uneven distribution of magnetic flux density formed by the electromagnet arrays when the levitating body 12 travels above the electromagnet track 1.

Figure 7:
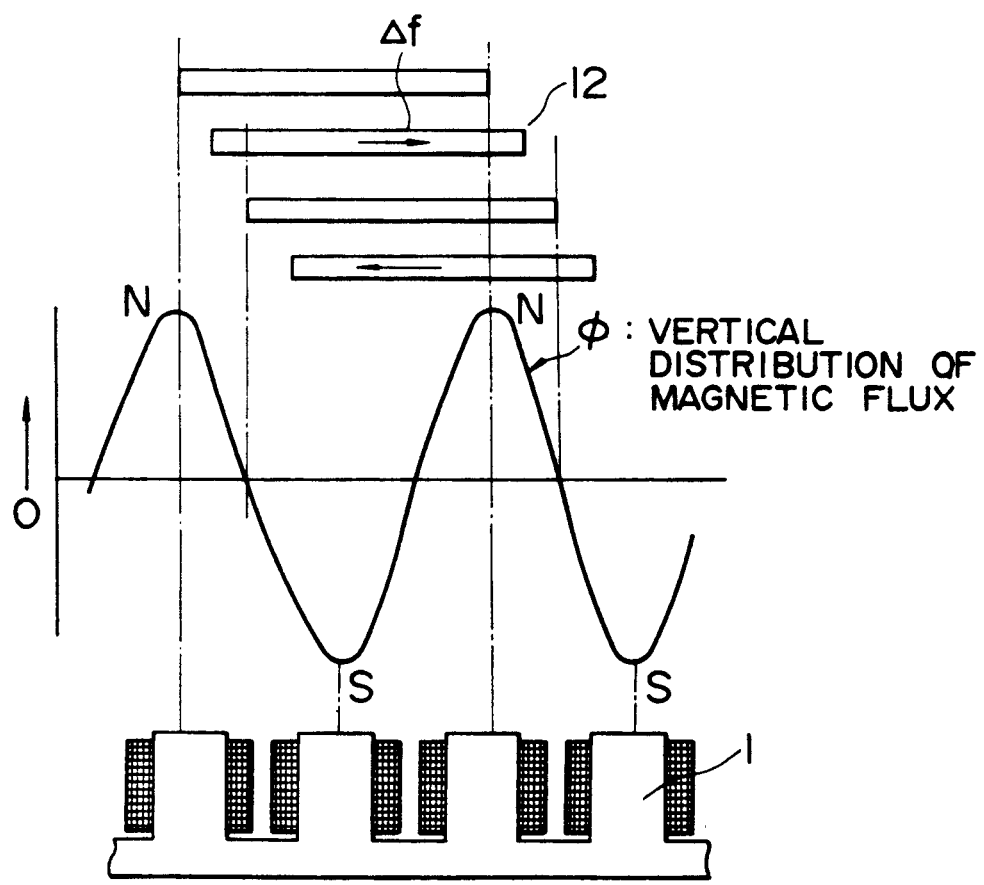
FIG. 7 is a diagram for explaining the problems in the apparatus in above-mentioned embodiment.

Namely, a variation of a steering force in the transporting direction is generated by the edge portion which meets at right angles with the transporting direction of the levitating body 12 in the travelling levitating body 12 similarly to the mechanism of generating a steering force in the width direction described previously. The state of affairs is shown as $\Delta f$ in FIG. 7. Further, the variation of the steering force in the transporting direction acts onto the levitating body 12 as an exciting force, resulting in oscillation of the levitating body 12. If this oscillation is violent, such a disadvantage is brought about that friction is generated between the levitating body 12 and a semiconductor wafer and the like placed on the levitating body 12, thus producing abrasion powder and resulting in marring of the merit of non-contact transportation. Further, in an extreme case, the levitating body 12 comes into contact with the electromagnet track 1 or a partition provided between the levitating body 12 and the track 1 sometimes, which has been very unfavorable.

In order to solve such a problem, a system in which a steering force generated in the conveying direction of the levitating body 12 is reduced by making the magnetic flux density distribution in the transporting direction of the electromagnet track 1 as uniform as possible may be considered. In order to execute such a system, however, the array pitch of the electromagnets of the electromagnet track 1 has to set small. Therefore, restrictions get bigger in manufacturing the electromagnet track 1, which has also caused increase in cost.

It is an object of the present invention to solve above-described problems.

Figure 8:
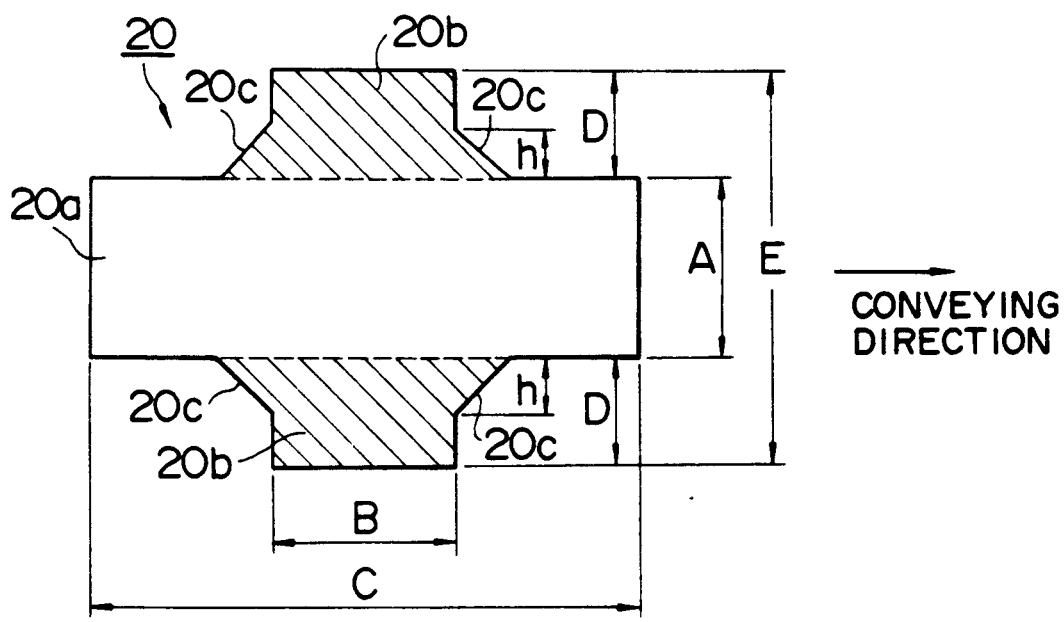
FIG. 8 is a plan view showing a construction of a levitating body used in a magnetic levitating transportation system in a second embodiment of the present invention.

FIG. 8 is a plan view showing a construction of a levitating body used in a magnetic levitating transportation system according to a second embodiment of the present invention.

This levitating body 20 has a central portion forming a rectangle and a pair of projected portions 20b, 20b which are projected in a direction meeting at right angles with the conveying direction on both side portions of the central portion 20a. The dimensions of these central portion 20a and projected portions 20b, 20b are set with respect to the electromagnet track (1 in FIG. 1), as follows. ·

① The maximum width E in the width direction including projected portions 20b, 20b is set wider than the outer width d of the electromagnet track 1.

② The width of the central portion 20a is set wider than the inner width a of the electromagnet track 1 and narrower than the outer width d.

③ The length C in the conveying direction is set two times and more of the installation pitch P of yokes of the electromagnet track 1.

④ The length B in the conveying direction of the projected portions 20b, 20b is set at an installation pitch P of the yokes of the electromagnet track 1 and longer.

Now, at corner portions at four locations formed by above-mentioned projected portions 20b, 20b and central portion 20a, stretching portions 20c are provided, respectively, as shown in the figure. These stretching portions 20c form isosceles triangles, and a length h of one side thereof is set at approximately ½ of the projected length D of the projected portions 20b, 20b.

With such a construction, the levitating body 20 of the present embodiment presents the following operation. Namely, the steering force in the conveying direction of the levitating body 20 reaches the maximum when the edge meeting at right angles with the conveying direction of the levitating body 20 is located in the vicinity of the yoke edge of the electromagnet track 1 as shown in FIG. 3 (b), but decreases when the location is shifted therefrom. Further, the magnitude of the steering force at each location reaches the maximum in the state that the edge of the levitating body 20 is in parallel with the yoke edge of the electromagnet, and decreases as the parallel state is collapsed and the angle gets larger. Therefore, if stretching portions 20c are provided on the edges meeting at right angles with the conveying direction of the projected portions 20b, 20b as the levitating body 20 of the present embodiment, the maximum value of the steering force in the conveying direction is lowered, and the variation of the steering force in the conveying direction when the levitating body 20 is conveyed is smoothed. As a result, the oscillation produced in the levitating body 20 being conveyed is reduced.

As described above, in the present embodiment, the variation of the steering force generated in the conveying direction is smoothed in the levitating body 20 being conveyed by providing stretching portions 20c for forming bevel portions on the edges of the projected portions 20b, 20b, thereby enabling to suppress pitching generated in the levitating body 20. Accordingly, friction between the levitating body 20 and a semiconductor wafer for instance placed on the levitating body 20 is reduced, thereby making it possible to perform highly reliable non-contact transportation by preventing generation of abrasion powder.

Further, since it is only required to provide stretching portions 20c at corner portions between the central portion 20a and the projected portions 20b, 20b, there is a merit that the construction can be formed very simply and inexpensively as compared with a case that the array pitch of the electromagnets of the electromagnet track 1 is set small.

Figure 9:
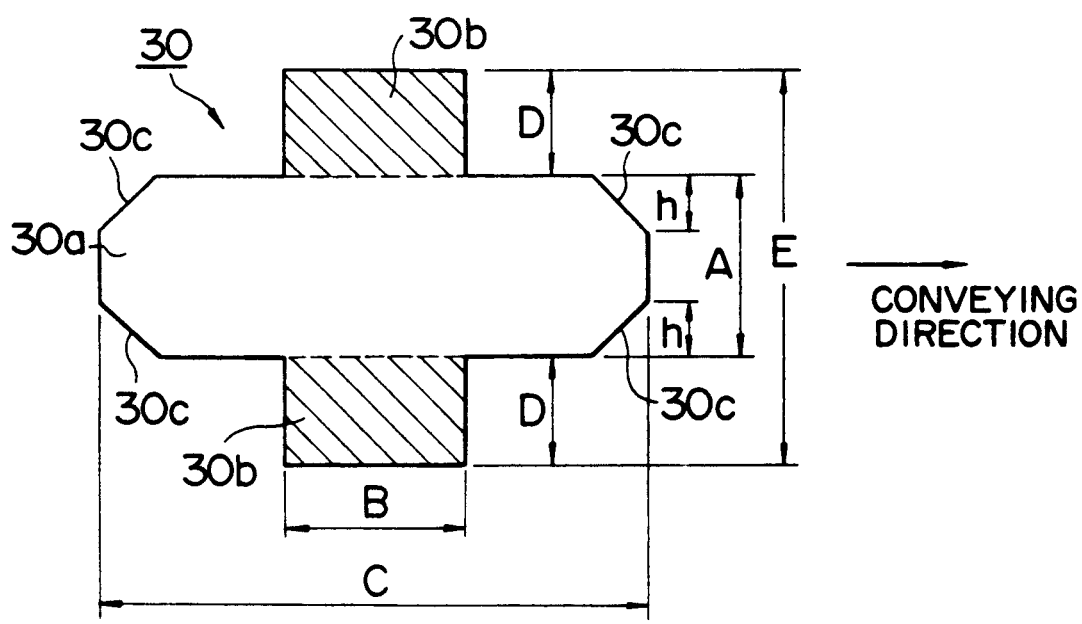
FIG. 9 is a plan view showing a construction of a levitating body used in a magnetic levitating transportation system in another embodiment of the present invention.

Incidentally, the present invention is not limited to above-described embodiment. For example, four corners of edges meeting at right angles with the conveying direction of a central portion 30a of a levitating body 30 may be cut off so as to form bevel portions 30c which do not meet at right angles with the conveying direction as shown in FIG. 9. Even with such a construction, it is possible to reduce the maximum value of the steering force in the conveying direction of the levitating body 30 and to smooth the variation of the steering force in a similar manner as above-described embodiment, thus reducing the oscillation generated in the conveying direction.

Further, it may also be arranged that, after providing stretching portions 20c in the projected portions 20b, 20b of the levitating body as shown in FIG. 8, the edges of the central portion 30a are cut off as shown in FIG. 9. With such a construction, it is possible to further reduce the variation of the steering force in the conveying direction of the levitating body. However, if above-described bevel portions are increased excessively, the steering force in the width direction of the levitating body is lowered as a side reaction thereof. Therefore, it is necessary to consider the balance between both in case the bevel portions are provided.

Furthermore, a levitating body constructed in a cross shape has been described in above embodiment, but the present invention may be applied other than the above to a levitating body which is constructed in an "H" shape by providing projected portions at the front portion and the rear portion of the central portion, respectively. Further, 3 pairs and more of projected portions may be provided, and furthermore, the present invention may be applied to a levitating body with a central portion formed in a double-barrel form. Also, the configuration of the bevel portion may be set in a circular arc form other than a straight line.

Other than the foregoing, the forming position, configuration and size of the bevel portion, the construction of the levitating body and so forth may be modified in a various manner within a scope which does not depart from the gist of the present invention.

As described above in detail, according to the present invention, the levitating body is constructed so as to include a main body member and projected members, and bevel portions are formed at end faces meeting at right angles with the transporting direction of at least one member among these main body member and projected members, thus making it possible to reduce oscillation in the conveying direction generated in the levitating body without causing increase in restrictions in manufacturing and increase in the cost. With this, it is possible to provide a magnetic levitating transportation system which is simple and inexpensive with little unwanted oscillation and high reliability.

The Third Embodiment

A third preferred embodiment of the present invention will be described hereafter in detail with reference to the drawings.

Figure 10:
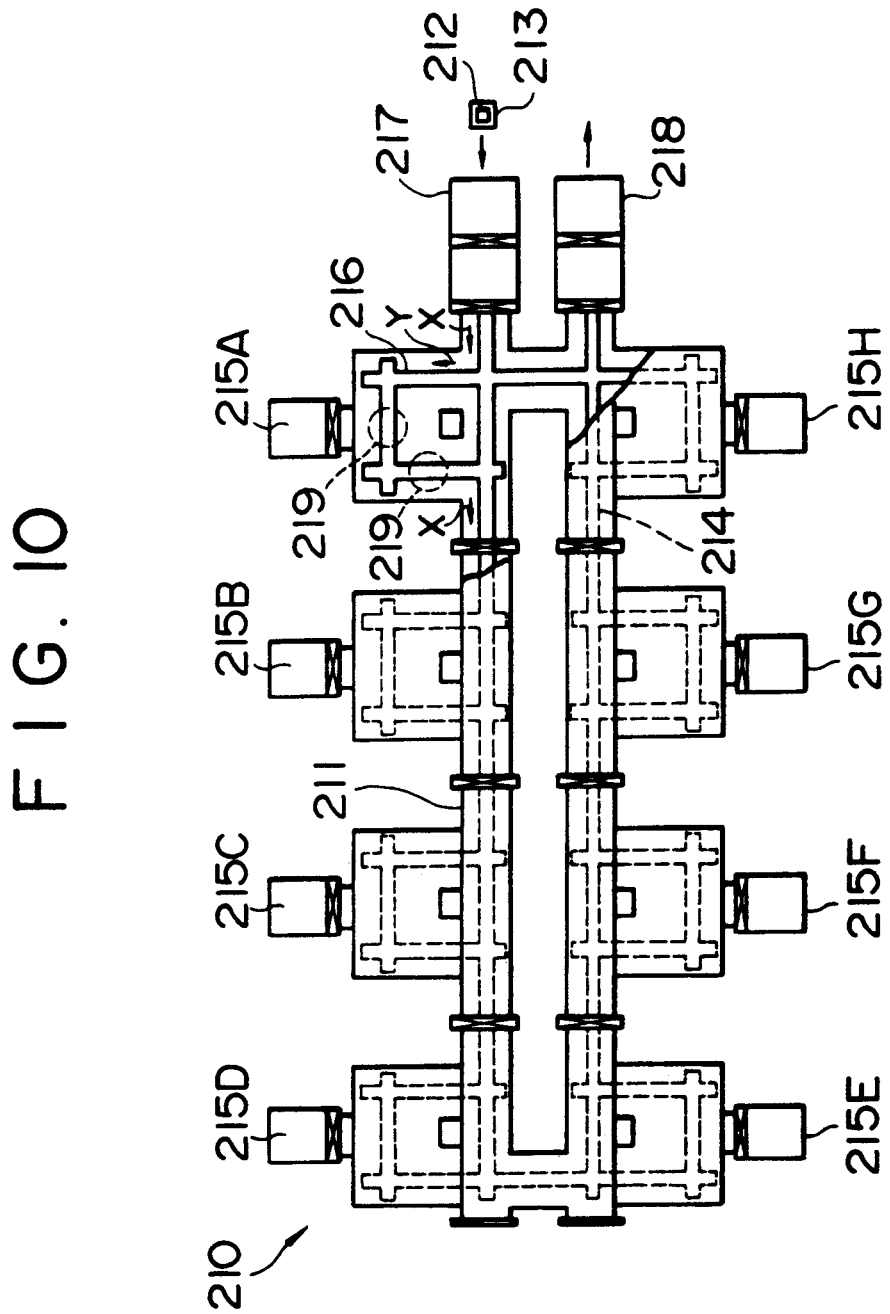
FIG. 10 is a schematic diagram showing a third embodiment of a magnetic levitating transportation system according to the invention.

FIG. 10 is a magnetic levitating transportation system which transports semiconductor wafers according to the present embodiment.

As shown in FIG. 10, a magnetic levitating transportation system 210 according to the present embodiment consists of a main transportation passage 214 through which a levitating body 213 on which a semiconductor wafer 212 is placed and turnout transportation passages 216 branching off from above-mentioned main transportation passage 214 for each of variety types of processing units 215A to 215H which process the wafer 212 in a vacuum tunnel 211. The levitating body 213 enters into the system from a load-lock chamber 217, and is drawn into respective turnout passages 216 while being transported above the main transportation passage 214 and processed in respective processing units (units for processing the semiconductor wafer 212 such as cleaning, resist application and etching) 215A to 215H, and is taken out of a load-lock chamber 218 thereafter.

Further, spaces 219 for holding and suspending the levitating body 213 are provided on respective turnout transportation passages 216 so that the levitating body 213 may be held and suspended appropriately.

As a result, since the levitating body 213 mounted with the wafer 212 enters into a relevant turnout passages 216 as occasion demands and is suspended or held thereafter, it will never be a transportation obstacle in the main transportation passage 214. Thus, it is possible to make time-wise adjustment among processing units easy.

Next, a transportation example of the present embodiment will be described with reference to FIG. 11 and FIG. 12.

Figure 11A:
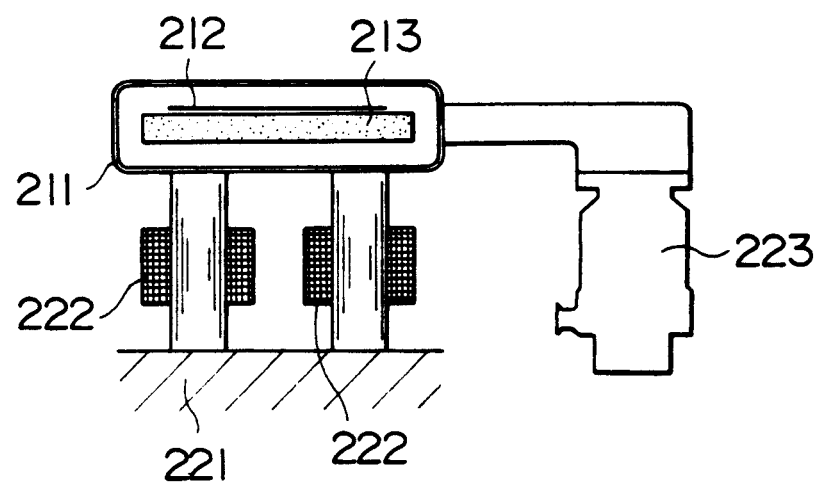
FIG. 11 is sectional views of a principal part thereof.
Figure 11B:
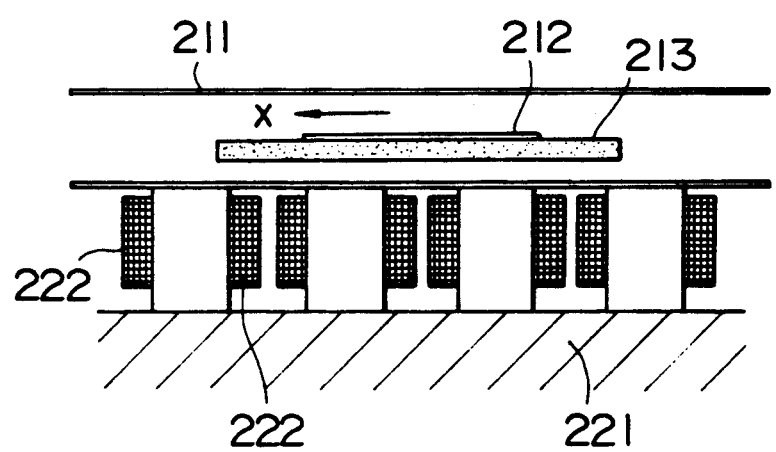

As shown in FIG. 11, an electromagnet group of a.c. electromagnets composed of two lines of electromagnets 222 is installed on a base substance 221 along the main transportation passage 214, and a levitating body 213 on which the semiconductor wafer 212 is placed is transported above these a.c. electromagnets. Besides, a non-magnetic material which is light and of high conductivity such as aluminum material is preferred for the levitating body 213.

Figure 12:
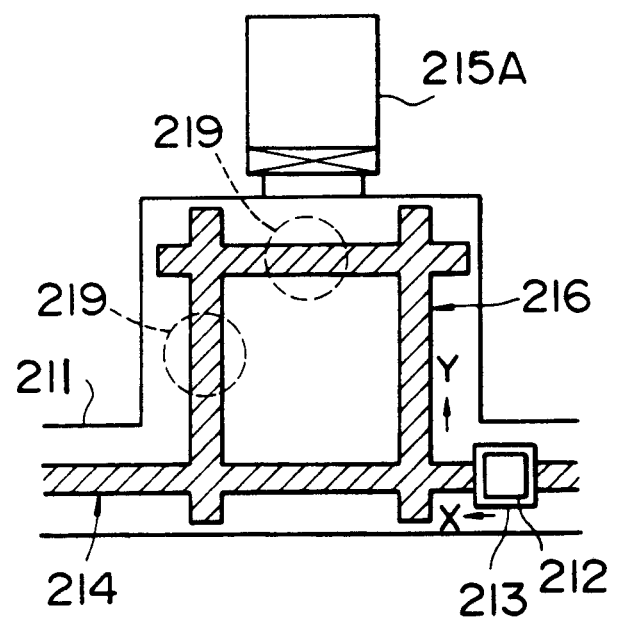
FIG. 12 is a schematic diagram showing a transportation state of a levitating body.

In FIG. 12, the levitating body 213 on which the semiconductor wafer 212 is placed which has travelled above the main transportation passage 214 in a direction shown with an arrow mark X is suspended at a branch point by means of driving force control of a linear motor. Then, the levitating body 213 is drawn into the turnout transportation passage 216 under exactly the same conditions as above-mentioned X direction by linear driving in a direction shown with an arrow mark Y. With this, travelling of the succeeding levitating body 213 above the main transportation passage 214 is made possible.

Besides, a numeral 223 in FIG. 11 (a) indicates a vacuum pump for always maintaining the inside of a vacuum tunnel 211 vacuous.

Since a magnetic levitating transportation system according to the present invention is provided with turnout transportation passages for installing processing units in the main transportation passage as described in detail with reference to the embodiments, the effects described hereunder are obtainable.

(1) A plurality of objects to be processed such as semiconductor wafers can be transported to a plurality of processing units without congestion in the main transportation passage.

(2) Furthermore, since spaces for holding and suspending a levitating body can be provided in the turnout transportation passages, time-wise adjustment among processing units becomes possible.

(3) As a result, the processing speed of objects to be processed such as semiconductor wafers has been increased remarkably and improvement of productivity by a large margin has become possible in a magnetic levitating transportation system provided with turnout transportation passages according to the present invention as compared with a conventional magnetic transportation system provided with a main transportation passage only.

The Fourth Embodiment

Figure 15:
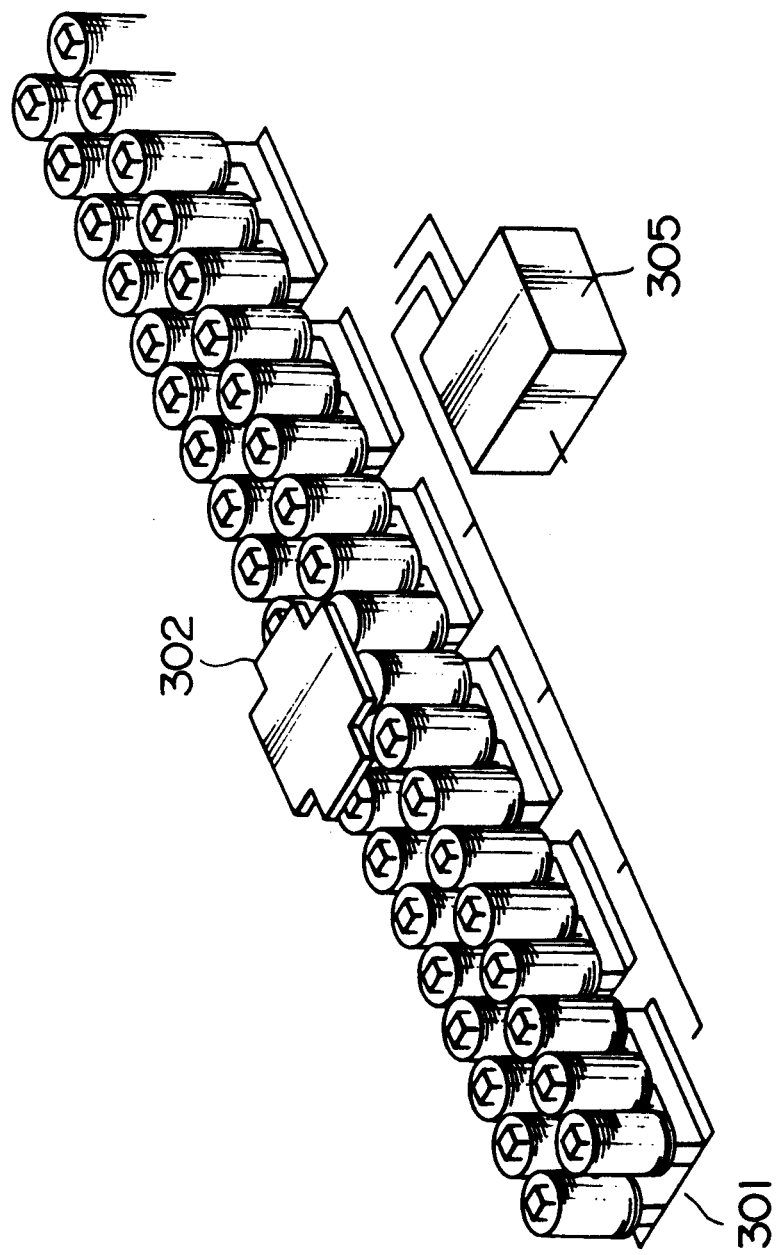
FIG. 15 is a perspective view showing a system in which one electromagnet line is disposed.

FIG. 15 shows a construction of a typical a.c. magnetic levitating transportation system. In FIG. 15, an add current of a single phase current and a three-phase current is supplied to a electromagnet array 301 from a power source 305. This single phase component generates an eddy current in a levitating body 302, and the eddy current generates a magnetic field. Since this magnetic field is formed in a repulsing direction against the magnetic field of the electromagnet array 301, the levitating body 302 levitates. On the other hand, a moving magnetic field is formed in the electromagnet array 301 by the three-phase component. This moving magnetic field generates an eddy current in the levitating body 302, and this eddy current acts with the moving magnetic field. Thus, the levitating body 302 is transported above the electromagnet array 301.

Figure 16:
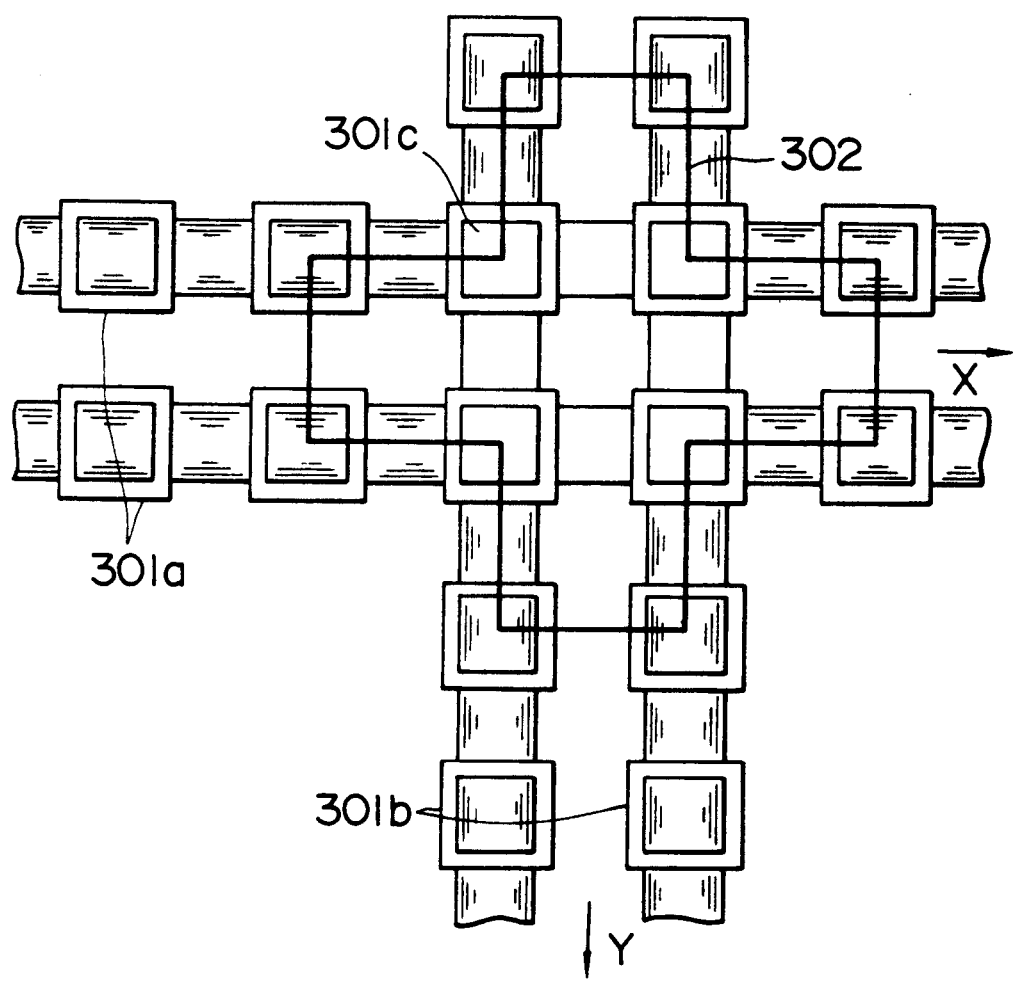
FIG. 16 is a plan view showing a system in which two electromagnet lines are disposed while intersecting with each other.

Further, another system will be described with reference to FIG. 16. In the present system shown in FIG. 16, electromagnet arrays 301a and 301b having directions different from each other are provided and arranged so that they intersect each other, an electromagnet 301c at a point of intersection is held in common, and the transporting direction of the levitating body 302 is altered on the electromagnet 301c.

Figure 13:
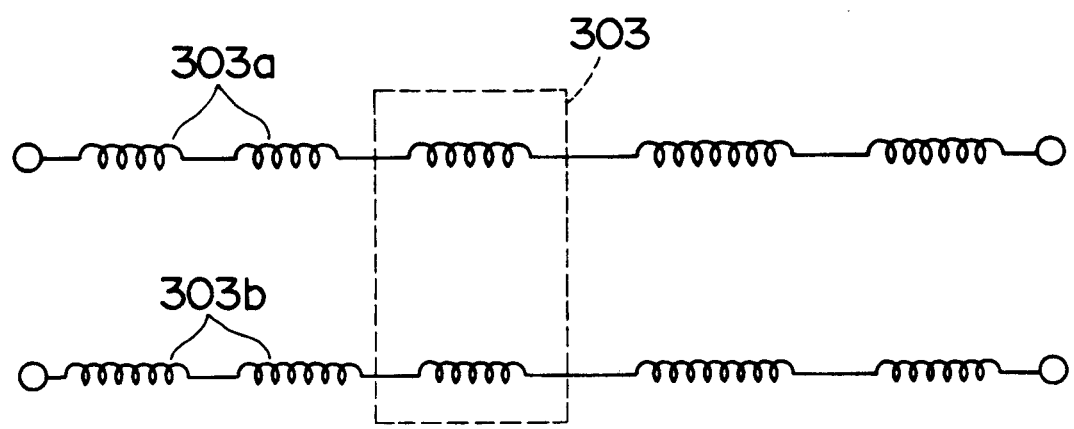
FIG. 13 is a connection diagram of coils of an electromagnet of the apparatus in above-mentioned embodiment.

When the levitating body 302 is transported above the electromagnet array 301a in X-direction and transported up to a point of intersection with the electromagnet array 301b in Y-direction, it is transported thereafter above the electromagnet array 301b in Y-direction. A coil 303 of the common electromagnet 301c located at the point of intersection of different electromagnet arrays 301a and 301b has a structure shown in FIG. 14. This coil 303 is usually formed in 2 to 3 pieces on a common iron core, but is formed of 3 pieces here and has a structure with coils 303a and 303b of the electromagnet array 301a in X-direction and the electromagnet array 301b in Y-direction put one upon another in two layers. The connecting method of electromagnets in this case is shown in FIG. 13, and wiring of the coil 303a of the electromagnet array 301a in X-direction and wiring of the coil 303b of the electromagnet array 301b in Y-direction are made independent.

Figure 14A:
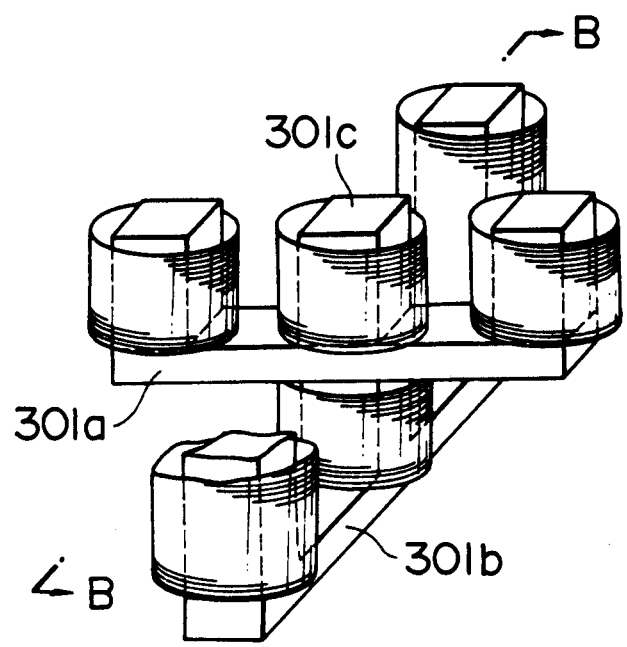
FIG. 14 shows explanatory views of an apparatus in which electromagnet lines intersect with each other, wherein (a) is a perspective view and (b) is a perspective view taken along an arrow mark B—B in (a)
Figure 14B:
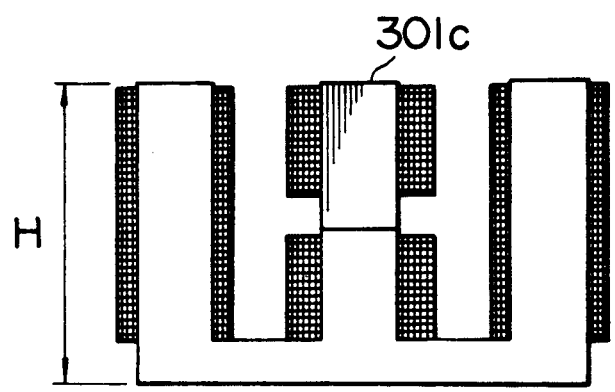

In this system, there have been such problems that the coil height H becomes high as shown in FIG. 14, which is disadvantageous for a manufacturing apparatus of semiconductors and the like having much restrictions on the space, and it is required to increase the number of turns of the coil because of large magnetic resistance and to prepare a power source of large electric power.

It is an object of the present invention to solve above-described problems.

Figure 17:
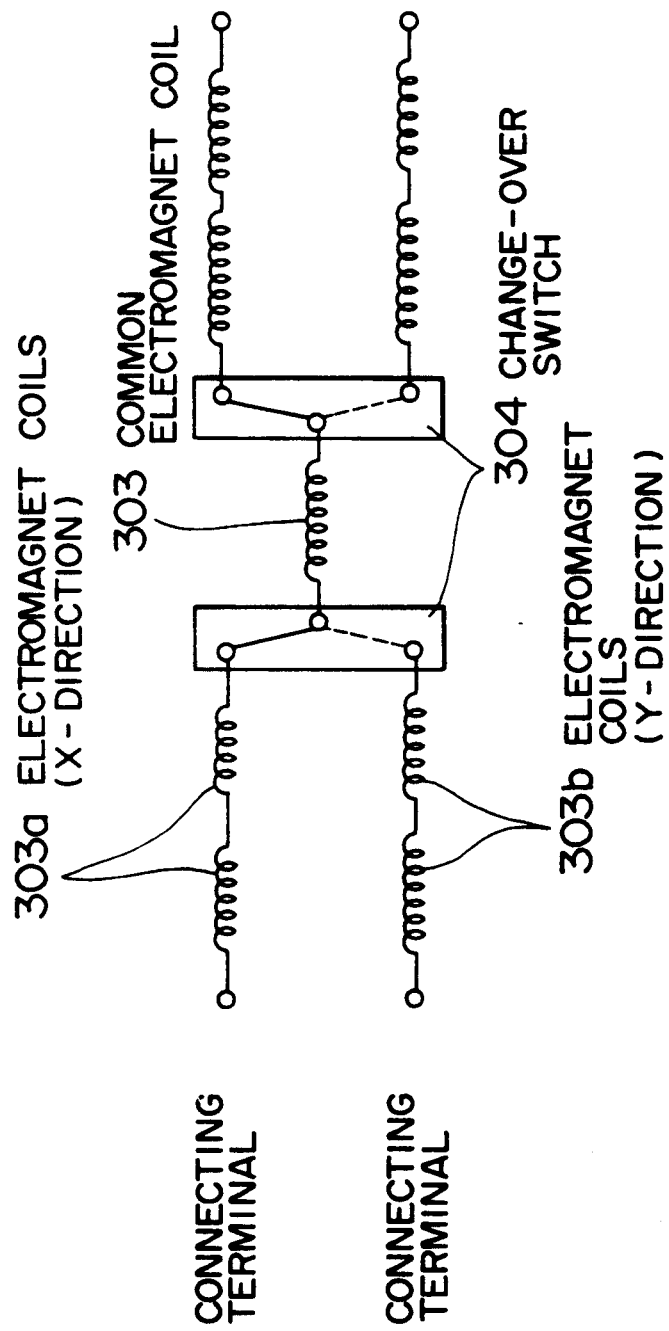
FIG. 17 is a connection diagram of coils of an electromagnet according to a fourth embodiment of the present invention.
Figure 18A:
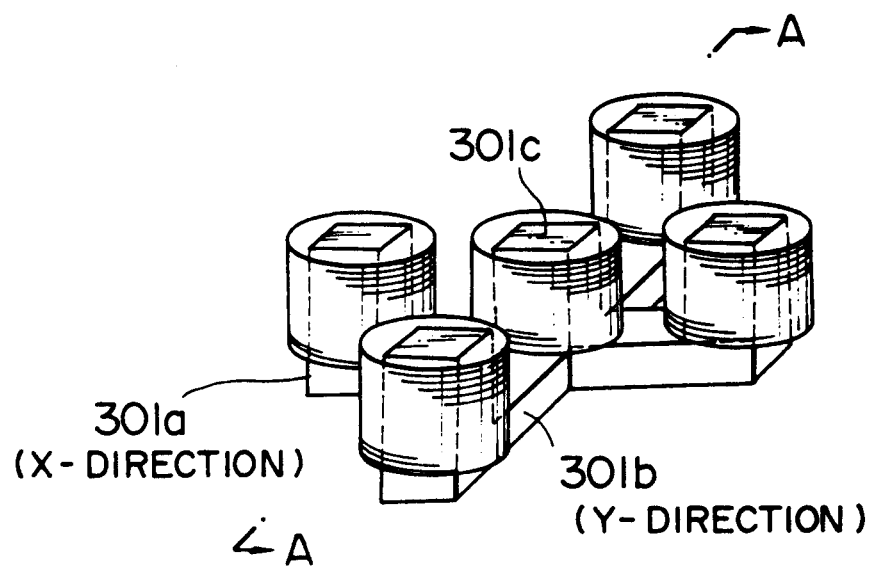
FIG. 18 shows explanatory views of above embodiment, in which (a) is a perspective view and (b) is a perspective view taken along an arrow mark A—A shown in (a)
Figure 18B:
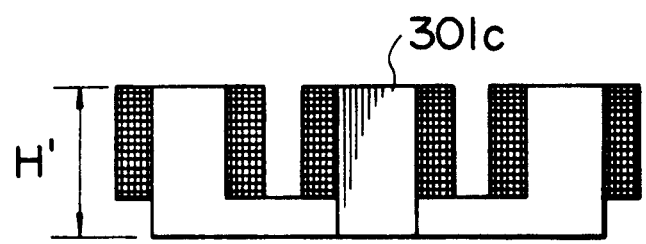

FIG. 17 and FIG. 18 show a fourth embodiment of the present invention. The present embodiment shown in FIG. 17 and FIG. 18 is provided with a common electromagnet 301c having a coil 303 disposed at an intersecting position of an electromagnet array 301a in X-direction over switches 304 which are connected across the coil 303 of the common electromagnet 301c and change over and connect the coil 303 to coils 303a of the electromagnets of the electromagnet array 301a in X-direction or coils 303b of the electromagnets of the electromagnet array 301b in Y-direction.

When the levitating body 302 is transported in Y-direction after transporting it in Y-direction in the above case, the change-over switches 304 are changed over so that the common electromagnet 301c may be used as the electromagnet array 301a in X-direction at the beginning, and the coil 303 is connected with the coils 303a.

Then, the levitating body 302 is transported by exciting the electromagnet array 301a in X-direction. After transporting the levitating body 302 to the point of intersection of the electromagnet array 301a in X-direction and the electromagnet array 301b in Y-direction, the change-over switches 304 are changed over, thereby to connect the coil 303 with the coils 303b so that the common electromagnet 301c may be used as the electromagnet array 301b in Y-direction, and the electromagnet array 301b in Y-direction is excited so as to transport the levitating body 302.

With the foregoing, it becomes not only possible to transport a levitating body which passes from above the electromagnet array in X-direction to above the electromagnet array in Y-direction, but also to reduce the height of the common electromagnet as compared with a conventional system. As a result, it becomes more advantageous to apply to a manufacturing apparatus of semiconductors and the like having much restrictions on the space, and it becomes further possible to cut down power consumption by reducing the number of turns of the coil since the magnetic resistance of the coil is small.

According to an a.c. magnetic levitating transportation system of the present invention, a magnetic pole coil of a common electromagnet located at a point of intersection of one and another electromagnet arrays is made connectable by change-over with a magnetic pole coil of one or another electromagnet array by a change-over means. With this, it becomes not only possible to transport a levitating body which passes from above one electromagnet array to above another electromagnet array, but also to reduce the height of the common electromagnet as compared with a conventional system. As a result, it becomes more advantageous to apply to a manufacturing apparatus of semiconductors and the like having much restrictions on the space, and it becomes further possible to cut down power consumption by reducing the number of turns of the coil since the magnetic resistance of the coil is small.

We claim:

1. A magnetic levitating transportation system comprising:
   (a) a first electromagnet array;
   (b) a second electromagnet array, said first and said second arrays comprising a plurality of coils, said coils having an outer side, said arrays forming a first parallel electromagnet array, said first parallel array having an inner distance between said coils of said first and second arrays, an outer distance measured from the outer side of said coils of said first and second arrays, and an electromagnetic pitch measured between adjoining coils of said first array;
   (c) means for generating an alternating magnetic field in said first parallel array;
   (d) a conductive paramagnetic metal body for levitating above said first parallel array, said body comprising:
      (1) a central portion comprising:
         (i) a longitudinal axis;
         (ii) longitudinal sides, said sides being parallel to said axis;
         (iii) first and second ends, said ends being perpendicular to said axis and connecting said sides;
         (iv) a first width, A, between said sides, governed by the relationship, $a < A < d$, wherein a represents said inner distance and d represents said outer distance; and,
         (v) a first length, C, between said first and second ends, said first length being governed by the relationship $C \geq 2(P)$, wherein P represents said electromagnetic pitch; and,
      (2) projected portions, symmetrically attached to said sides comprising:
         (i) an outer side parallel to said axis;
         (ii) third and fourth ends, said third and fourth ends connecting said outer side to one of said longitudinal sides, and being perpendicular thereto;
         (iii) a second width, D, between said outer side and one of said longitudinal sides, said second width being governed by the relationship $D > (d - A)/2$; and
         (iv) a second length, B, between said third and fourth ends, said second length being governed by the relationship $B \geq P$.

2. The magnetic levitating transportation system of claim 1, wherein:
   (a) said second length, B, is further governed by the relationship $a < B < d$;
   (b) said first width, A, and said second width, D, are further governed by the relationship $A + 2(D) \geq 2(P)$;
   (c) said first length, C, is further governed by the relationship $C > d$; and,
   (d) said electromagnetic pitch, P, is governed by the relationship $P \leq A$.

3. The magnetic levitating transportation system according to claim 2 further comprising:
   (a) a second parallel electromagnet array, said second parallel array being perpendicular to and connected to said first parallel array; and,
   (b) means for generating an alternating magnetic field in said second parallel array.

4. The magnetic levitating transportation system according to claim 3 further comprising:
   (a) a third parallel electromagnet array, said third parallel array being perpendicular to and connected to said second parallel array;
   (b) a fourth parallel electromagnet array, said fourth parallel array being perpendicular to and connected to said third parallel array and said first parallel array; and,
   (c) means for generating an alternating magnetic field in said third and fourth parallel arrays.

5. The magnetic levitating transportation system according to claim 4 further comprising a processing unit located on said third parallel array for processing an object carried on said body.

6. The magnetic levitating transportation system of claim 2 further comprising bevels being formed at said connections between:
   (a) said first and second ends and said longitudinal sides;
   (b) said third and fourth ends and said longitudinal sides; and
   (c) said third and fourth ends and said outer sides.

7. The magnetic levitating transportation system according to claim 3 further comprising means for using said coils of said first parallel array located at said connection of said first and said second parallel arrays for levitating said body travelling above said first parallel array and said body travelling above said second parallel array.

8. The magnetic levitating transportation system of claim 1, wherein:
   (a) said first width, A, and said second length, B, are further governed by the relationship $A = B$;
   (b) said first width, A, said first length, C, and said second width, D, are further governed by the relationship $C = A + 2(D)$; and
   (c) said projected portions being connected to said central portion at a position equidistant from said first and second ends.

9. The magnetic levitating transportation system according to claim 8 further comprising:
   (a) a second parallel electromagnet array, said second parallel array being perpendicular to and connected to said first parallel array; and,
   (b) means for generating an alternating magnetic field in said second parallel array.

10. The magnetic levitating transportation system according to claim 9 further comprising:
    (a) a third parallel electromagnet array, said third parallel array being perpendicular to and connected to said second parallel array;

(b) a fourth parallel electromagnet array, said fourth parallel array being perpendicular to and connected to said third parallel array and said first parallel array; and, (c) means for generating an alternating magnetic field in said third and fourth parallel arrays.

11. The magnetic levitating transportation system according to claim 10 further comprising a processing unit located on said third parallel array for processing an object carried on said body.

12. The magnetic levitating transportation system of claim 8 further comprising bevels being formed at said connections between:

(a) said first and second ends and said longitudinal sides;

(b) said third and fourth ends and said longitudinal sides; and (c) said third and fourth ends and said outer sides.

13. The magnetic levitating transportation system according to claim 9 further comprising means for using said coils of said first parallel array located at said connection of said first and said second parallel arrays for levitating said body travelling above said first parallel array and said body travelling above said second parallel array.

14. The magnetic levitating transportation system of claim 1 further comprising bevels being formed at said connections between:

(a) said first and second ends and said longitudinal sides;

(b) said third and fourth ends and said longitudinal sides; and (c) said third and fourth ends and said outer sides.

15. The magnetic levitating transportation system according to claim 1, wherein said body is constructed from non-magnetic metal.

* * * * *